(12) United States Patent
Gaynes et al.

(10) Patent No.: US 8,785,217 B2
(45) Date of Patent: Jul. 22, 2014

(54) TUNABLE RADIATION SOURCE

(75) Inventors: Michael A. Gaynes, Vestal, NY (US); Michael S. Gordon, Yorktown Heights, NY (US); Nancy C. LaBianca, Yalesville, CT (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 13/230,798

(22) Filed: Sep. 12, 2011

(65) Prior Publication Data

US 2013/0062740 A1    Mar. 14, 2013

(51) Int. Cl.
*G01R 31/26*    (2014.01)
*H01L 21/66*    (2006.01)

(52) U.S. Cl.
USPC ..................................... 438/15; 257/E23.115

(58) Field of Classification Search
USPC ..................................... 438/15; 257/E23.115
See application file for complete search history.

(56) References Cited

U.S. PATENT DOCUMENTS

| | | | |
|---|---|---|---|
| 6,914,447 B2 | 7/2005 | Baumann | |
| 7,081,635 B2 | 7/2006 | Baumann | |
| 7,084,660 B1 | 8/2006 | Ackaret | |
| 7,238,547 B2 | 7/2007 | Zabel | |
| 7,381,635 B2 | 6/2008 | Cabral, Jr. | |
| 7,649,257 B2 * | 1/2010 | Gordon et al. | ............... 257/737 |
| 2003/0172322 A1 | 9/2003 | Kitamorn | |
| 2003/0191978 A1 | 10/2003 | Kitamorn | |
| 2005/0186326 A1 | 8/2005 | Baumann | |
| 2006/0220654 A1 | 10/2006 | Zabel | |
| 2008/0273393 A1 | 11/2008 | Chen | |
| 2008/0308747 A1 | 12/2008 | Gordon | |
| 2009/0243053 A1 | 10/2009 | Cabral, Jr. | |
| 2011/0127438 A1 | 6/2011 | Cabral, Jr. | |
| 2011/0175211 A1 | 7/2011 | Cabral, Jr. | |

OTHER PUBLICATIONS

Eckert & Ziegler, "Electrodeposited Standards". Downloaded from www.ezag.com on Aug. 22, 2011.
"S R I M , The Stopping and Range of Ions in Matter" downloaded from http://www.srim.org/SRIM/SRIMINTRO.htm Aug. 24, 2011.
"TRIM-Setup and Input", from Chapter 8 of the SRIM textbook (2008) "SRIM—The Stopping and Range of Ions in Matter".
"TRIM: Output Files", from Chapter 9 of the SRIM textbook (2008) "SRIM—The Stopping and Range of Ions in Matter".

* cited by examiner

*Primary Examiner* — Thien F Tran
(74) *Attorney, Agent, or Firm* — Louis J. Percello; Otterstedt, Ellenbogen & Kammer, LLP

(57) ABSTRACT

An energy distribution of soft error-inducing radiation likely to be encountered by an electronic circuit during operation is determined. A tuned radiation source having a source energy distribution similar to the determined energy distribution is prepared. The electronic circuit is tested using the tuned radiation source.

16 Claims, 11 Drawing Sheets

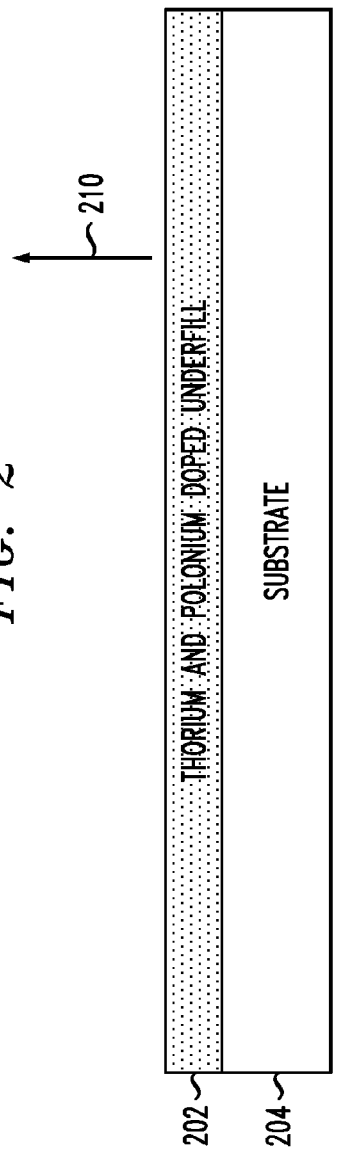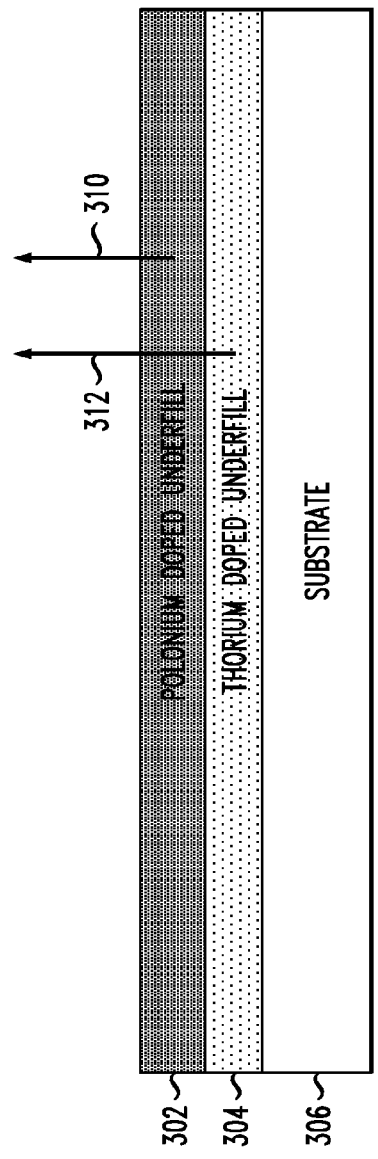

TUNABLE RADIATION SOURCE

STATEMENT OF GOVERNMENT RIGHTS

Not Applicable.

CROSS-REFERENCE TO RELATED APPLICATIONS

Not Applicable.

FIELD OF THE INVENTION

The present invention relates to the electrical, electronic and computer arts, and, more particularly, to electronics packaging and interconnection technology and the like.

BACKGROUND OF THE INVENTION

Soft errors involve changes to stored data, as opposed to changes to the physical circuit itself. Soft errors may be caused, for example, by alpha particles from radioactivity in packaging materials and/or from the impact of neutrons from space. It is known to carry out accelerated testing on electronic circuits to estimate the effects of soft errors, by deliberately exposing the circuits to radiation.

For example, U.S. Pat. No. 7,238,547 of Zabel et al., the complete disclosure of which is expressly incorporated herein by reference in its entirety for all purposes, discloses packaging integrated circuits for accelerated detection of transient particle induced soft error rates. An IC device is packaged for accelerated transient particle emission by doping the underfill thereof with a transient-particle-emitting material having a predetermined, substantially constant emission rate. The emission rate may be tunable. In one aspect, a radioactive adhesive composition is provided for bonding a semiconductor device to a chip carrier. The radioactive adhesive composition is made from a cured reaction product including a resin and a filler, and may be reworkable or non-reworkable. Either the resin or the filler, individually or both together as a mix, are doped substantially uniformly with the transient-particle-emitting material, thereby putting the transient-particle-emitting in close proximity with the IC to be tested. The underfill is formulated to have a stable chemistry, and the doped particles are encapsulated, so as to contain the emissions. Accelerated transient-particle-emission testing may then be performed on the IC in situ to provide accelerated detection of soft errors.

SUMMARY OF THE INVENTION

Principles of the invention provide techniques for a tunable radiation source. In one aspect, an exemplary method includes the steps of determining an energy distribution of soft error-inducing radiation likely to be encountered by an electronic circuit during operation; preparing a tuned radiation source having a source energy distribution similar to the energy distribution determined in the determining step; and testing the electronic circuit with the tuned radiation source.

In another aspect, an exemplary structure includes a substrate; an integrated circuit chip attached to and spaced from the substrate so as to define a gap there-between; and an underfill material interposed in the gap. The underfill material in turn includes a tuned radiation source having a plurality of individual radiation sources interposed with a plurality of absorbers.

In still another aspect, an exemplary method includes determining a pillbox shaped energy distribution appropriate for calibrating a gas proportional detector; preparing a tuned radiation source having a source energy distribution similar to the energy distribution determined in the determining step; and calibrating the gas proportional detector with the tuned radiation source.

In a further aspect, an exemplary method includes modeling an energy distribution of soft error-inducing radiation likely to be encountered by an electronic circuit during operation; selecting an alpha-particle emitting isotope with an emission energy that is greater than a maximum predicted in the modeling step; selecting a desired activity of the alpha-particle emitting isotope; selecting the absorber; modeling alpha particle transmission through the absorber; checking whether a result of the modeling step closely matches the energy distribution from the determining step; and specifying the tuned radiation source in accordance with the modeling if the checking is affirmative.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof (for example, aspects of system modeling prior to manufacturing) can be implemented in the form of a computer program product including a computer readable storage medium with computer usable program code for performing the method steps indicated. Furthermore, one or more embodiments of the invention or elements thereof (again, for example, aspects of system modeling prior to manufacturing) can be implemented in the form of a system (or apparatus) including a memory, and at least one processor that is coupled to the memory and operative to perform exemplary method steps. Yet further, in another aspect, one or more embodiments of the invention or elements thereof (once again, for example, aspects of system modeling prior to manufacturing) can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide one or more of the following advantages:

More accurate estimates of the single-event upset rates caused by radioactivity in the vicinity of the active elements in memory and logic can be made using HUF (hot underfill) that has the same energy spectrum as that from the packaging environment The response of charged-particle detectors, proportional, and ionization detectors, and their supporting electronics to radiation sources can be better understood for radiations sources with tailored energy distributions.

These and other features and advantages of the present invention will become apparent from the following detailed

BRIEF DESCRIPTION OF THE DRAWINGS

FIG. 2 shows mixing of multiple isotopes in an underfill;

FIG. 3 shows a hot underfill with layers of different isotopes;

DETAILED DESCRIPTION OF PREFERRED EMBODIMENTS

One or more embodiments provide a radiation source with a tunable energy distribution. Radioactive isotopes emit, for example, X-rays, gamma-rays, neutrons, alpha particles, or beta particles (electrons). Neutrons from space may interact with computer chips or other circuits and may cause soft errors, as discussed above. For example, a neutron from space will impact some material in the chip and this causes production of charged particles with significant energy, which may potentially upset the memory and/or logic state of a microprocessor. The energy deposited per path length by x-rays or gamma-rays, for devices in use today, is too low to upset the memory of logic states. In addition, the alpha particles from residual radioactivity in the packaging can also cause bits to flip.

The aforementioned U.S. Pat. No. 7,238,547 of Zabel et al. addresses, inter alia, spiking, i.e., adding radioactivity to an underfill. An underfill is the epoxy or similar material used to stabilize the back side of a chip where it is wired. Some applications use Controlled Collapse Chip Connection (C4) technology, also known as "flip chip," with lead or tin alloys to provide wiring. The lead can emit radioactivity. U.S. Pat. No. 7,381,635 of Cabral, Jr. et al., the complete disclosure of which is expressly incorporated herein by reference in its entirety for all purposes, discloses a method and structure for reduction of soft error rates in integrated circuits, which addresses this latter issue. The aforementioned U.S. Pat. No. 7,238,547 of Zabel et al. involves deliberately adding radioactivity to the underfill to determine the sensitivity of the chip to radioactivity so that the error rate from the residual radioactivity in the packaging can be estimated. Then, the structure with the deliberately-added radioactivity is removed and a chip without radioactive underfill is installed for actual usage in a server or the like. Prior techniques have employed, for example, alpha particles, with a maximum energy of 5.3 MeV, from the decay of Polonium, which has worked well.

Figure 12:
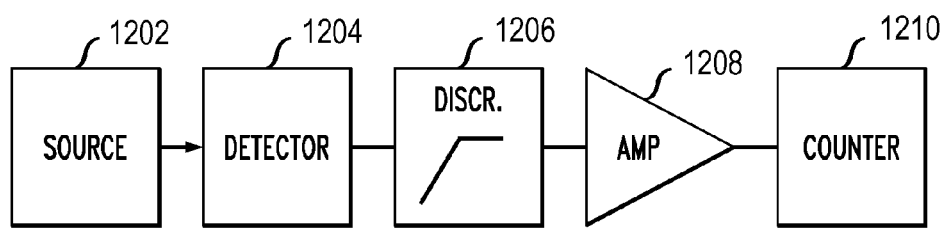
FIG. 12 depicts a source in accordance with an aspect of the invention adjacent a detector, with a discriminator, amplifier, and counter.

One or more embodiments advantageously further enhance previous techniques by providing a radioactive source which has an energy distribution which is tuned to be similar to that which would be obtained from the materials surrounding the chip. For example, if it is desired to simulate the response of a system from Uranium, a source that looks like Uranium is advantageous; if it is desired to simulate the response of a system from Thorium, a source that looks like Thorium is advantageous, and so on. Some applications imply the need for a top hat or pill box shape, i.e., a constant emission rate versus energy which then sharply drops off at a maximum energy. Referring to FIG. 12, suppose that such a "pill box" source 1202 is placed adjacent to or within the detector 1204, and a certain count rate is measured by counter 1210. Suppose that a discriminator 1206 on the amplifier 1208 eliminates alpha particles below a discriminator threshold. It is instructive to examine how the detector system responds to the source as the threshold is raised. If the source distribution or energy spectrum is flat as described, the count rate will decrease linearly as a function of raising the discriminator threshold. In this regard, imagine a flat distribution and that the location where the integration begins (lower bound of the integral) is gradually moved from the lowest to greatest energy. The count rate will be largest with the discriminator set at the lowest energy, zero if the discriminator is set at the maximum or greater energy, and half of the maximum count rate if the discriminator is set in the middle. Thus, in at least some instances, having a flat distribution in energy advantageously simplifies detector calibration and discriminator setting.

One or more embodiments provide a laminated source that provides a desired energy distribution, which can be demonstrated by modeling using commercial software or fabricated and demonstrated experimentally by measuring the energy spectrum.

Note that it is possible to purchase a mono-energetic source that has a unique energy, place an absorber in front of it, and then measure the energy downstream of the absorber. The attenuation of the flux from the source as the alpha-particles are transmitted through an absorber is a function of the energy of the alpha-particles, as well as the material in the absorber and its thickness. The width of the energy peak from a monoenergetic source is broadened as the alpha-particles are transmitted through an absorber. A single attenuator (foil) in front of a given source may not be sufficient to tailor the energy distribution to any desired energy distribution.

In one or more embodiments a tuned source is laminated using a source (or using a plurality of sources) and one or more absorbers to obtain the desired energy distribution. Note that certain current applications use two sources together and are employed to calibrate a detector faster (i.e., with two peaks) than if two different sources were used, but are not implemented for the purposes of generating a desired energy distribution.

Figure 1:
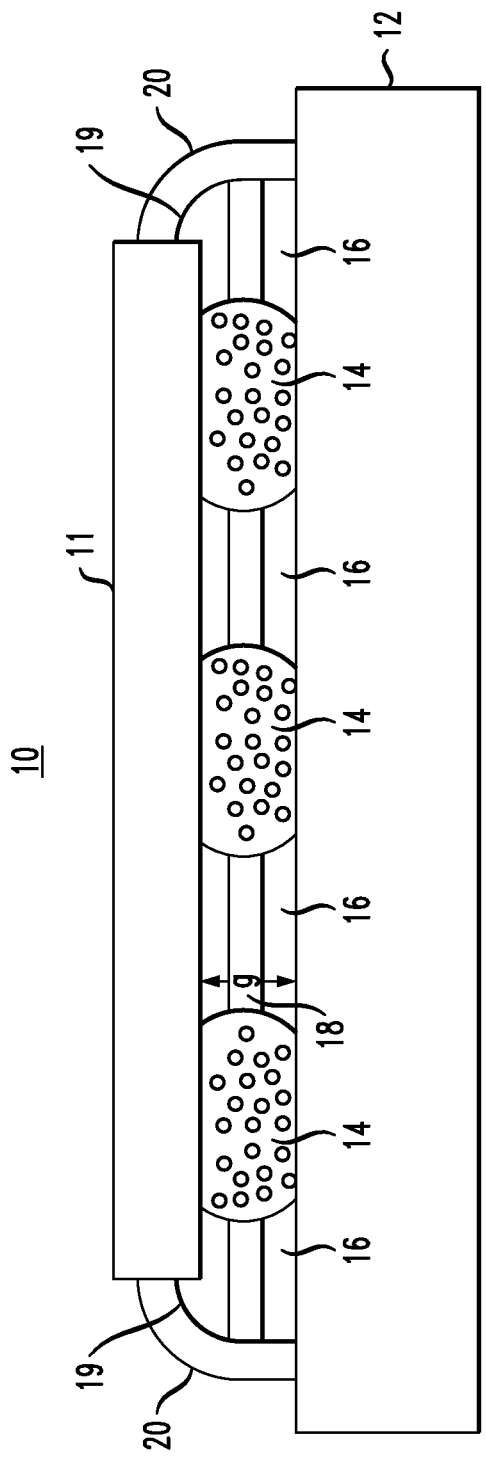
FIG. 1 depicts an integrated circuit (IC) chip having a hot underfill with a tunable radiation source in accordance with an aspect of the invention.

With attention now to FIG. 1, in accordance with an aspect of the invention, an integrated circuit (IC) device is packaged for accelerated transient particle emission by doping the underfill thereof with at least one transient-particle-emitting material, the doped underfill being referred to herein as a "hot underfill" or "HUF," and having an energy distribution tuned in accordance with one or more aspects of the invention. FIG. 2 shows the application of two isotopes that are mixed prior to being applied to the gap between the chip and carrier, as described below. FIG. 1 illustrates an exemplary IC device 10 including a chip 11 attached to a carrier substrate 12 using, for example, bonds 14 and having a tuned underfill 16 in accordance with an aspect of the invention. A gap (g) 18 between the active chip surface and the carrier substrate surface is typically on the order of about, for example, 100 microns. (An exemplary range for the gap may be on the order of 5-125 microns.) The radioactive underfill, or "hot" underfill, is formulated to flow into the gap between the chip and carrier by, for example, capillary flow, such that the gap is completely filled, forming a void-free film. The flow characteristics of the hot underfill are such that fillets 19 form from the horizontal carrier surface and climb, or extend above, the vertical thickness of the chip edge.

In at least some instances, the volume and surface area of radioactive fillets 19 are reduced in order to minimize emission of radioactive particles to the ambient. A vacuuming or wicking process may be employed to reduce the fillet size. In a vacuuming process, for example, a standard pressure feed fluid dispense tool is used in a vacuum pick-up mode to pick up the radioactive underfill fillet. Alternatively, in a wicking process, an exemplary wicking fabric, such as a lint-free clean room cloth, is used to contact the radioactive underfill, which is picked up through wicking action.

After radioactive fillet 19 is reduced in size, a soft-cure, or B-stage cure, is completed to solidify the radioactive underfill. Next, a cold, or undoped, underfill material (CUF) 20, that is preferably chemically compatible with the hot underfill, is dispensed over the remaining, reduced-in-size HUF fillet in order to encapsulate it and provide a cover barrier to the radioactive underfill. The underfill is then fully cured, resulting in a structure with any exposed HUF being protected from surface abrasion or erosion by CUF fillet 20, resulting in reduced radioactive emissions to the ambient.

An exemplary underfill includes a silica filler. A filler material may be electrically conductive or non-conductive, or thermally conductive. An exemplary tuned underfill in accordance with an aspect of the invention is described in connection with FIGS. 2, 3, and 10, for example. Furthermore, non-limiting exemplary spin coating, needle rastering, and stencil or screen printing techniques are discussed below.

Note that FIG. 1 is a non-limiting example and tuned sources in accordance with one or more embodiments of the invention can also be used in other applications, such as for external sources not integrated with the underfill material.

One or more embodiments permit the use of a flux of alpha particles to accelerate the soft error rate of a memory or logic devices or other devices employing electronic circuitry, where the alpha flux energy distribution is tailored to match the real spectrum expected from the surrounding packaging and joining materials. In one or more embodiments, this is accomplished by using layers of materials, each doped with alpha emitters to a desired level. Upon curing (at low temperature) additional thermal anneals can be performed to surface segregate the alpha particle generators. By carefully choosing the materials, radioactive isotopes, and their strength in each layer, and any subsequent anneals, one can produce a hot underfill with any desired alpha-particle energy spectrum, which can be applied to a chip or to a series of chips, to accelerate server and system soft error rate testing. The ability to tune the energy spectrum is believed to be advantageous as compared to current techniques. One or more embodiments permit matching the energy spectra of a chip's normal surroundings, but accelerating the flux to speed up reliability characterization. Unlike prior techniques, one or more embodiments yield an energy spectrum that is tunable and which allows matching the real alpha energy spectrum seen by a chip on a package.

One or more embodiments shape the energy spectrum of a HUF material by producing the HUF from a series of thin film layers—each doped with a suitable alpha particle source and annealed to obtain the desired amount of surface segregation. The alpha particles generated from the surface will typically have a strongly peaked energy distribution with a narrow full width at half maximum (FWHM) compared to those alpha particles that originate at an appreciable depth from the surface. The number of alpha particles (E<9 MeV) emitted from a depth >10 μm will be significantly reduced in intensity. By suitably combining sources of alpha particles with a wide (broad) energy distribution with surface alpha particle sources, it is possible to tailor the overall energy spectrum to any desired shape and intensity. This is believed to be a significant advantage over existing art.

Wafer or chip level underfill processing is well suited to applying thin layers of underfill to a controlled thickness to either an entire wafer or individual chips or substrates. Rather than attaching a chip to a substrate in a solder reflow process and then applying the capillary underfill into the gap between the chip and substrate, the underfill material is formulated so that thin coatings are preapplied to the wafer or chip or even the substrate prior to chip joining. A common method to apply an underfill material to a surface prior to chip joining is spin coating. Alternatively, the underfill material could also be applied by rastering a dispensing needle under robotic control over the surface of the chip or substrate. A third process to preapply the underfill material is stencil or screen printing. One skilled in the art will appreciate that there are several process choices that can be used to preapply a thin coating to the surface. In applying coatings of material that are radioactive, it is desirable to use a process that will minimize waste and clean-up. Since the number of experimental parts is few (typically less than 10 for a single experiment) to conduct accelerated soft error rate testing compared to high volume production (typically tens of thousands to millions), a preferred coating application process would be to use a robot and raster a dispensing tip across the surface of the wafer, chip or substrate. Layers of coating can be built up to a final total layer which thickness ideally ranges between 25 and 100 μm but which could range from 5 μm to greater that 100 μm. In order to achieve thin coatings, as thin as 1 μm or 10 μm, solvents are used. After applying a coating with the aid of a solvent, a solvent removal step is required. This can typically be accomplished by soft baking between 50 to 120 C, depending on how reactive or latent the cure chemistry is, and how thick the coating is, for 10 to 30 minutes. After the soft bake, a second layer can be applied over the first layer, followed by a second soft bake. Each layer can be formulated with a radiation source to provide a multi layered composite that meets a desired energy spectrum. Wafer level underfills are formulated to have latent cures so that after the coating application, no cure occurs for many days to many weeks when stored at room temperature. During the heating in the chip attach process to the substrate, the preapplied underfill experiences a viscosity dip which allows it to flow out of the space between the solder joints on the chip and solder attach sites on the substrate. While at the high temperature of solder joining, the curing of the underfill is sufficiently latent that it does not become solid before solder melting and joining, but remains in a low viscosity, fluid state. After solder joining is accomplished, the curing of the underfill is accomplished either by extending the heated portion of the reflow or by cooling down to room temperature and completing the cure in a batch oven process which typically would be 150 C for two hours.

FIGS. 2 and 3 show non-limiting examples of HUF with multiple isotopes. In FIG. 2, a single layer of underfill 202, doped with both Thorium and Polonium, is provided on substrate 204. Note emissions from the single layer at 210. This is a non-limiting example which demonstrates that in general, it is possible to mix multiple isotopes in an underfill. In FIG. 3, serial layers are provided, namely a Polonium-doped top layer 302 and a Thorium-doped intermediate layer 304 on substrate 306. Serial layers are believed to be acceptable when the top layer is <10 μm. Note emissions from the Polonium layer at 310 and from the Thorium layer at 312.

Figure 4:
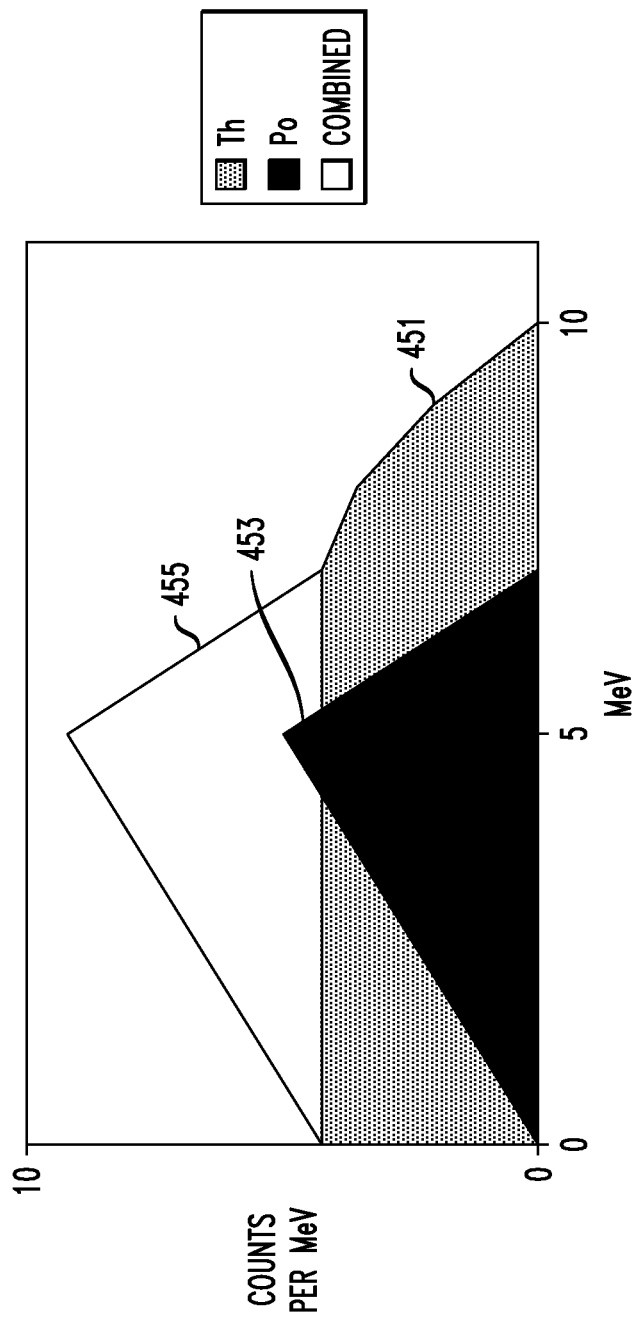
FIG. 4 shows an exemplary energy spectrum for multiple isotopes.

FIG. 4 shows an exemplary energy spectrum in counts per unit time on the vertical axis versus alpha-particle energy on the horizontal axis for Thorium 451, Polonium 453, and the two combined at 455, as would be expected for the serial source shown in FIG. 3.

Figure 5:
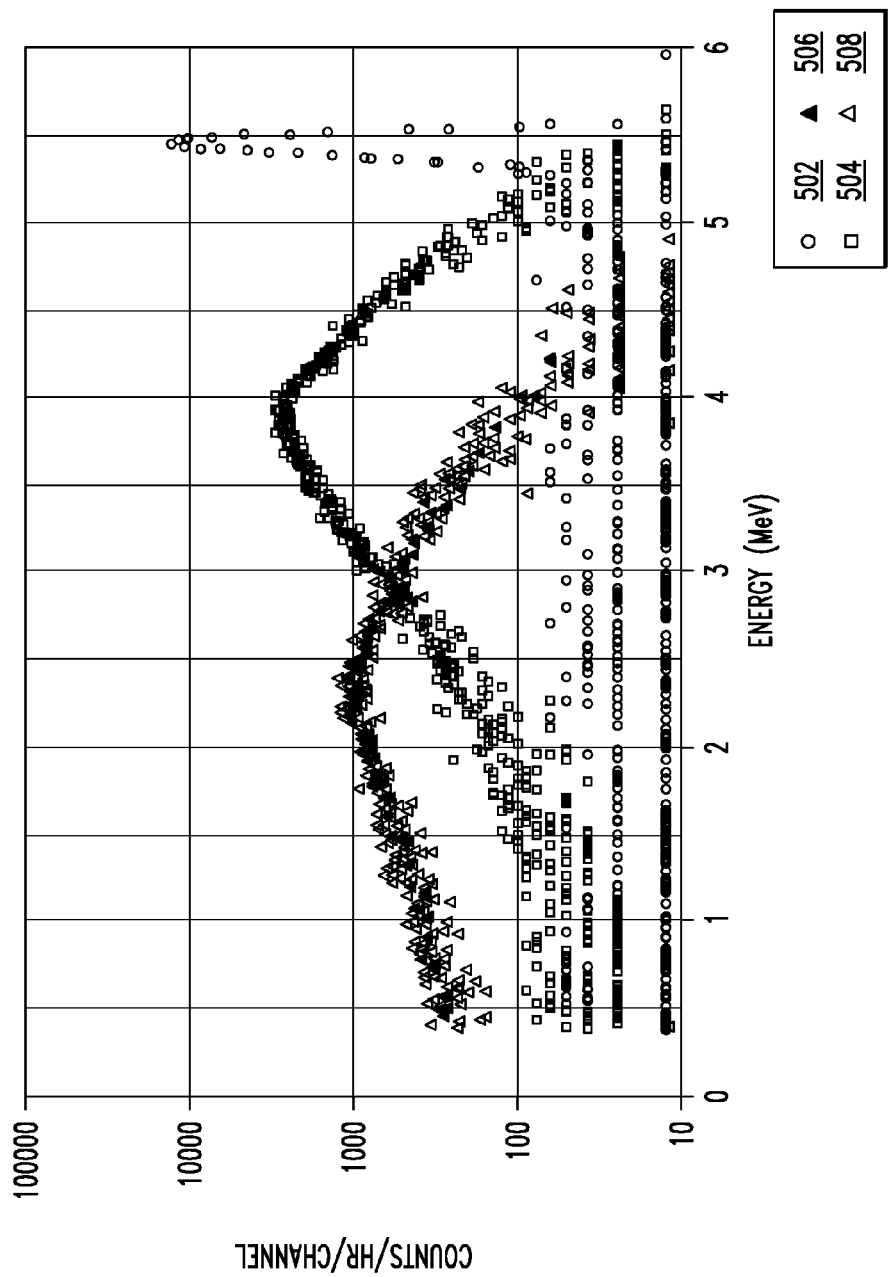
FIG. 5 shows the energy spectrum of a mono-energetic source transmitted through copper foils.

FIG. 5 shows measured energy spectra for the transmission on a mono-energetic source of alpha-particles (Americium 241 ($^{241}$Am)) through copper foils of varying thickness. In particular, the symbols 502 correspond to no foil; the symbols 504 correspond to a 2.9 μm foil; the symbols 506 correspond to a 5.8 μm foil; and the symbols 508 correspond to an 8.7 μm foil. The vertical axis is a logarithmic scale of counts per hour per channel, while the horizontal axis is the energy of the detected alpha particles in millions of electron volts; i.e., 2 on the horizontal axis corresponds to 2 MeV. This demonstrates that the peak is broadened as the alpha particles from the monoenergetic source pass through absorbers as discussed earlier.

Figure 6:
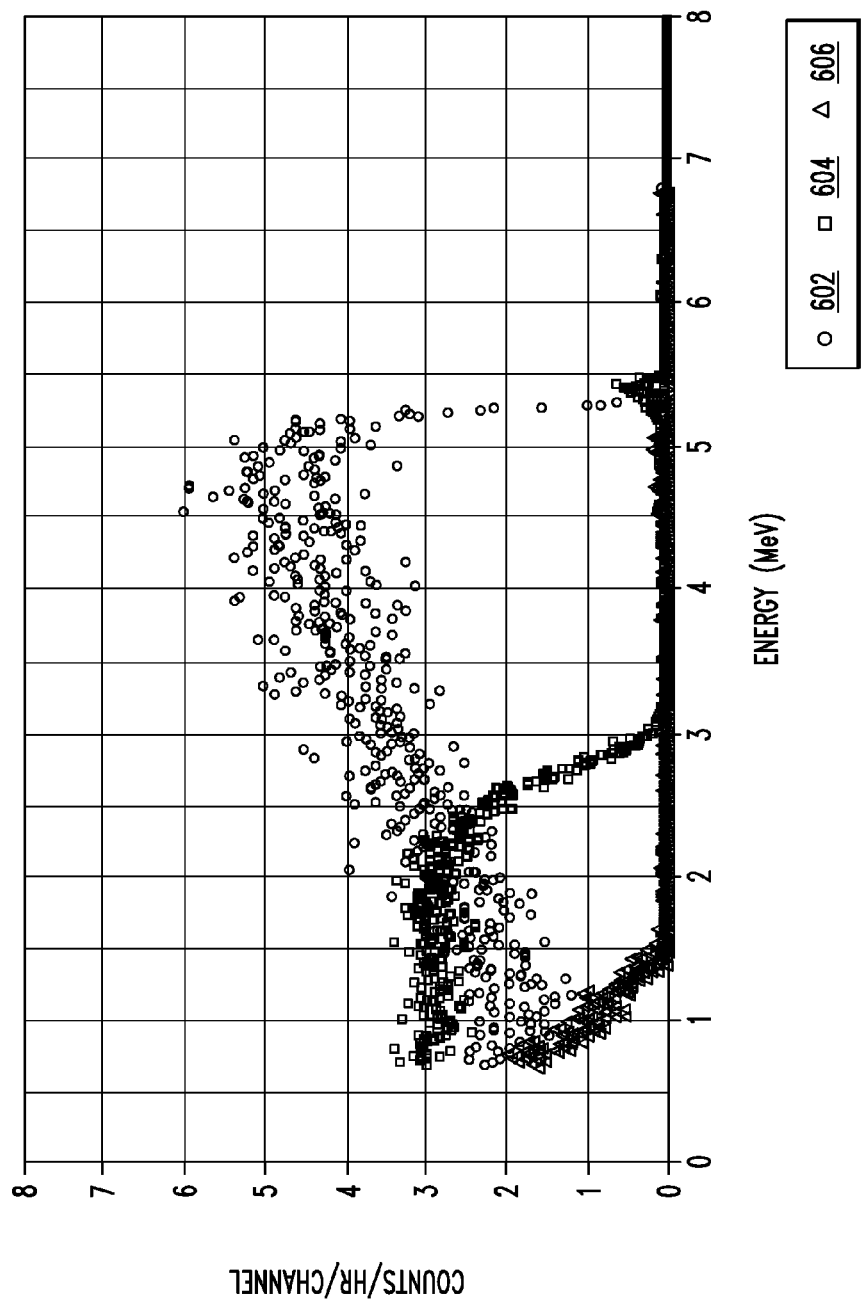
FIG. 6 shows the energy spectrum of a HUF source and after transmission through copper foils.

FIG. 6 shows measured energy spectra for the transmission of a HUF source made with $^{210}$Pb through copper foils of an exemplary HUF. In particular, the symbols 602 correspond to no foil; the symbols 604 correspond to a 6.5 μm foil; and the symbols 606 correspond to a 9.7 μm foil. The vertical axis is a linear scale of counts per hour per channel, while the horizontal axis is the energy of the detected alpha particles in millions of electron volts; i.e., 2 on the horizontal axis corresponds to 2 MeV. The triangular shape, given by the symbols 602, is due to the superposition of the $^{210}$Pb alpha-particle-emitting isotope through a thick layer of HUF. The flux of alpha-particles deep in the HUF is attenuated more than those near the surface, which creates the triangular distribution. This demonstrates that the shape, maximum energy, and flux are reduced as the alpha-particles from a "thick" source (defined below) are transmitted through absorbers.

Figure 7:
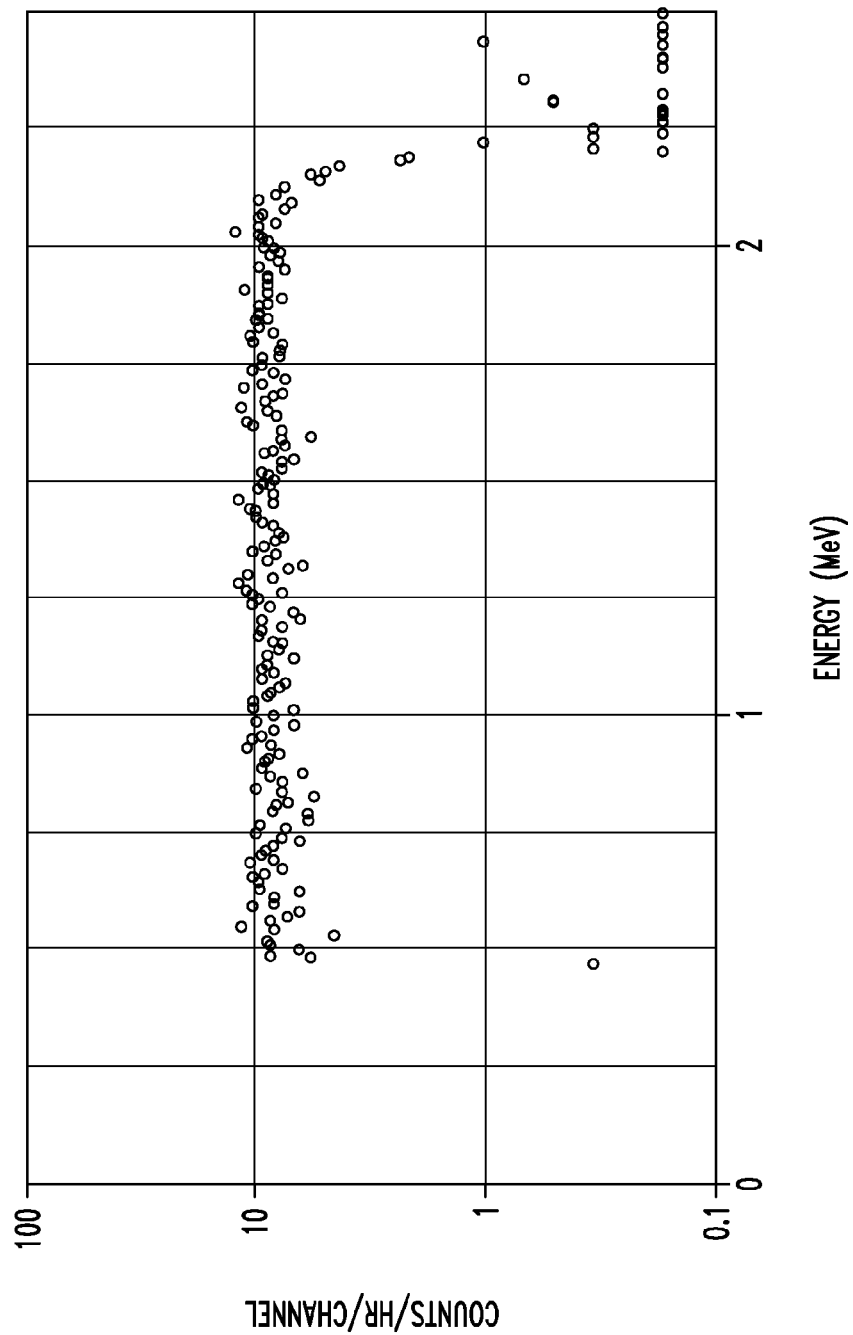
FIG. 7 shows energy distribution from a Samarium source.

FIG. 7 shows the measured alpha-particle energy spectrum of a source that was fabricated. The vertical axis is a logarithmic scale of counts per hour per channel, while the horizontal axis is the energy of the detected alpha particles in millions of electron volts; i.e., 1 on the horizontal axis corresponds to 1 MeV. The "top hat" nature of the distribution is visible with the rapid rise near 0.5 MeV and rapid fall between 2 and 2.25 MeV.

Thus, with regard to the superposition of sources, it will be appreciated that multiple isotopes can be mixed together; the activity of each source relative to one another can be changed; isotopes and their activity can be mixed with absorbers to obtain any desired energy spectrum; and/or absorbers can be added on top of or between HUF layers to alter the energy spectrum.

Figure 8:
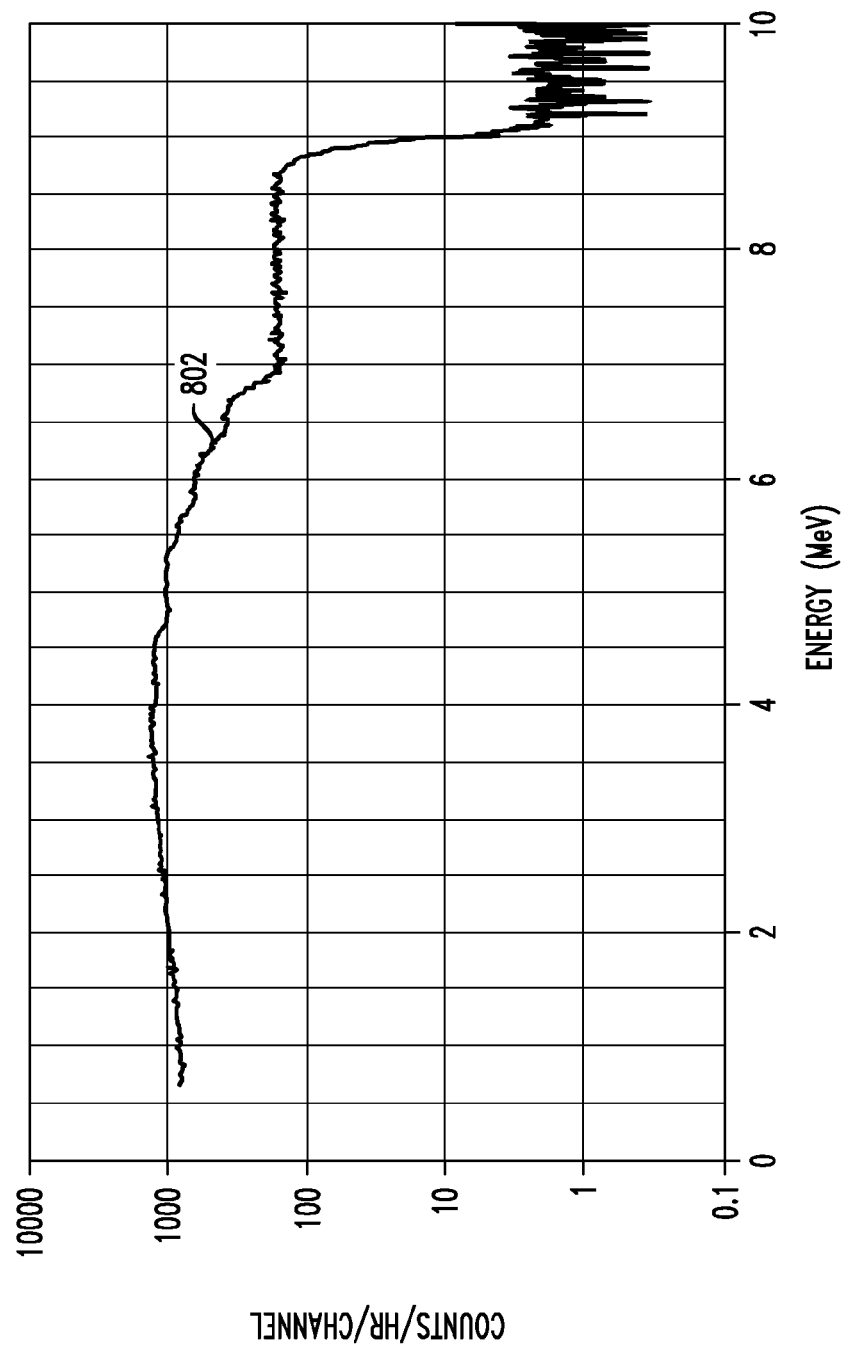
FIG. 8 shows exemplary emissions from a $^{232}$Th source

Alpha-particle radiation sources are routinely used for accelerated single-event testing of memory and logic devices, as well as calibrating particle detectors. FIG. 8 shows the measured alpha-particle energy spectrum from a thick $^{232}$Th source. Sources such as this are routinely used to initiate single-event-upsets when they are incident upon circuits at the wafer level since the source has a broad range of energy. Mono-energetic radiation sources of man-made isotopes such as $^{241}$Am, $^{230}$Th, and others, are available at a wide range of alpha-particle emission strength or flux. "Thin" sources are usually electro-deposited onto a substrate. The radioactive isotope is physically "thin," meaning that there is little or no energy loss in the material itself. Generally the sources are thin enough that the energy loss of the alpha particles through the medium is less than about 10 keV. This is useful for calibrating the energy of a detection system since the alpha-particles are emitted at a specific, well-defined energy. The resulting FWHM of the peak on a multi-channel analyzer then can be attributed to noise from the detector and/or the electronics.

On the other end of the spectrum are "thick" sources, where the thickness of the radioactive material is comparable to, or thicker than, the range of the alpha particles in the material. An exemplary form is shown in FIG. 8 for a thick $^{232}$Th source. In many materials, the range of alpha particles with energies of a few MeV is tens of μm. The resulting energy spectrum resembles a "white" source; that is, it is a continuous distribution. As an example, consider a $^{232}$Th source, which is ~0.5 mm thick. Although there are six alpha-emitting isotopes in the decay chain (daughters of $^{232}$Th) each with specific alpha-particle energies, the resulting energy spectrum is a continuum up to the energy of the maximum energy as shown in FIG. 8 for the data points 802. The peaks, corresponding to the emission from the daughters in the $^{232}$Th decay, are not observed; again, since the source is "thick."

As alluded to elsewhere, a source may not exist with the desired shape of the energy spectrum. As an example, for single-event upset (SEU) testing using either an external (hand-held) source, or using Hot Underfill (HLTF), it might be desirable to use a source with the same energy distribution as the local environment (from C4 connections, underfill, ceramic packaging, and the like as discussed elsewhere herein). Additionally, as also noted elsewhere herein, a source with a "pill-box" shape (e.g., constant emission vs. energy) is desirable in some cases such as for calibrating the response of a commercial alpha-particle gas proportional counter, as described below. One or more embodiments advantageously provide radioactive, alpha-particle emitting sources with tunable energy distributions.

Figure 9:
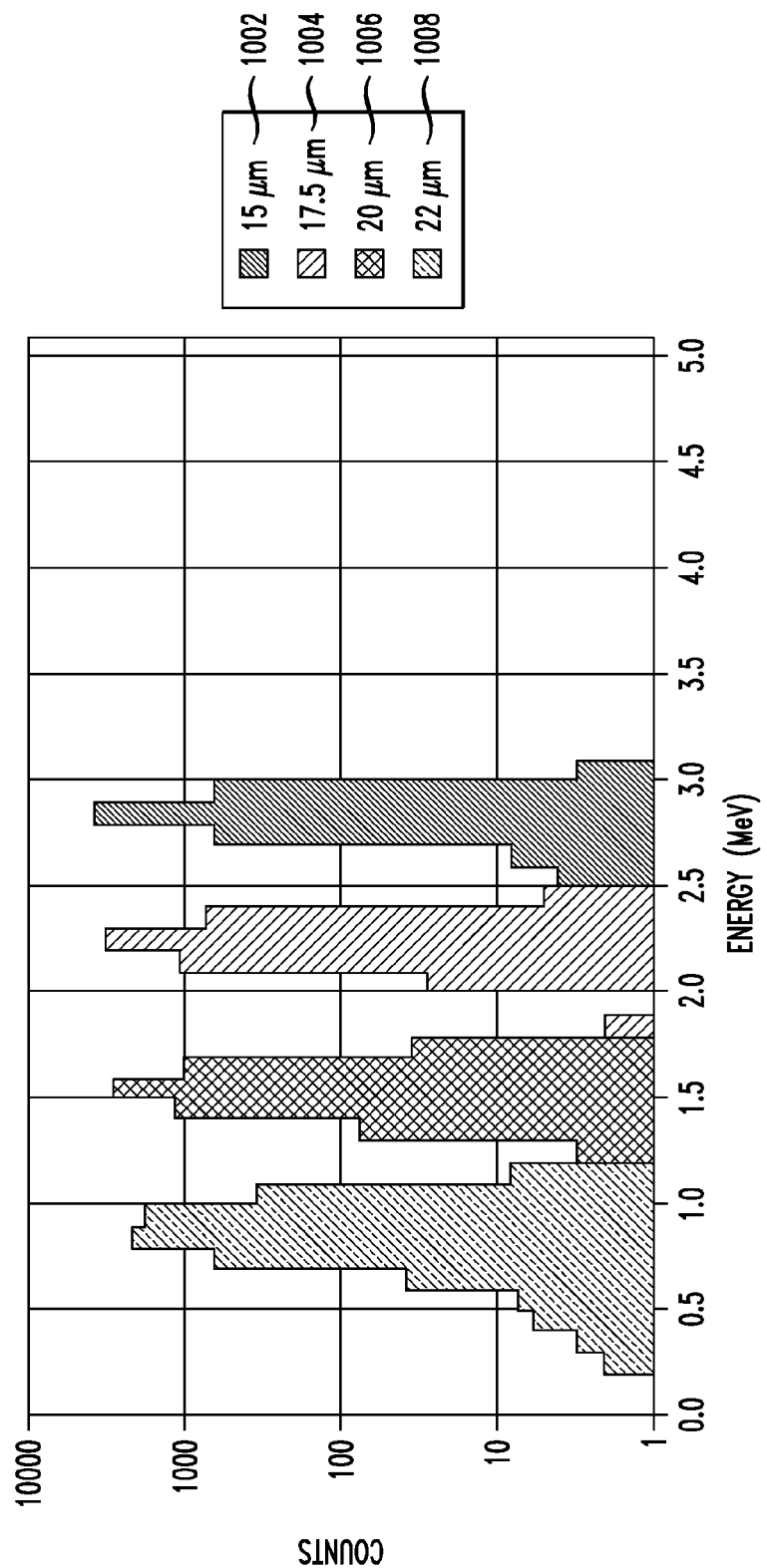
FIG. 9 shows a computer simulation of energy of alpha particles from a $^{241}$Am source (5.486 MeV) after they have traversed thin aluminum foils of various thicknesses.

As mentioned above, simply adding layers of material in front of a mono-energetic source merely lowers the flux, and broadens and shifts the peak energy to a lower energy as shown in FIG. 5 for a monoenergetic and in FIG. 6 for a thick source. The energy distribution of an alpha-particle source can be altered by using different alpha-emitting isotopes with different activities, and by using a series of absorbers of various thicknesses. FIG. 9 shows a simulation using the program TRIM (the Transport of Ions in Matter), available from James F. Ziegler of the SRIM organization, where alpha particles from $^{241}$Am at 5.486 MeV impinge on aluminum absorbers of various thicknesses, ranging from 15 μm to 22 μm. Note reference characters 1002 for 15 μm, 1004 for 17.5 μm; 1006 for 20 μm; and 1008 for 22 μm. The energy distribution of the alpha particles after traversing through the thin aluminum foils is plotted for foils of several thicknesses. This shows that using a single monoenergetic source and a single absorber cannot generate a variety of energy distributions. The absorber attenuates the flux, widens the energy distribution, and lowers the peak energy as shown in FIG. 9.

Figure 13:
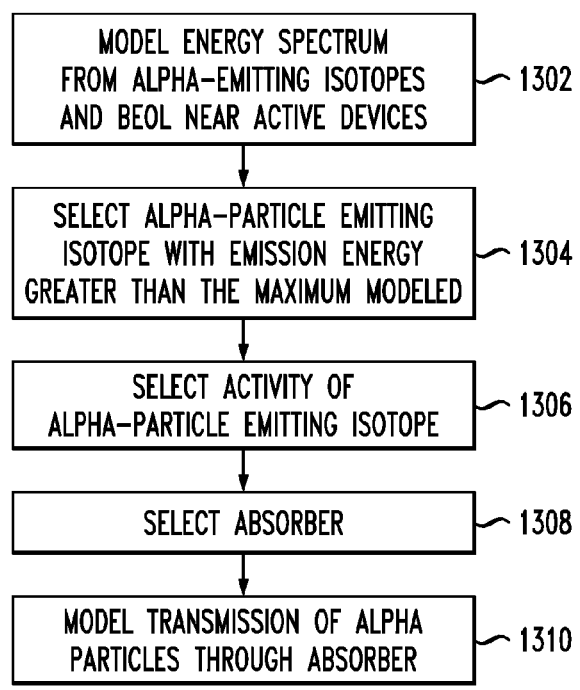
FIG. 13 is a flow chart of exemplary steps required to model a source of a given desired energy spectrum.

It is possible to create virtually any energy distribution from a mono-energetic source by constructing a lamination of thin or thick sources of various strengths between materials of various thicknesses. As seen in FIG. 13, in step 1302, model the energy spectrum from alpha-emitting isotopes and back end of line (BEOL) near active devices. Such modeling can be carried out using techniques that are known per se, as discussed elsewhere herein. In step 1304, select an alpha-particle emitting isotope with an emission energy that is greater than the maximum predicted by the model. In step 1306, select the desired activity of the alpha-particle emitting isotope, and in step 1308, select the absorber. In step 1310, model the transmission of alpha particles through the absorber; if this matches the desired energy spectrum to closely match the predicted energy spectrum from step 1302; the process continues; otherwise, iterate until a sufficient match is achieved.

Figure 10:
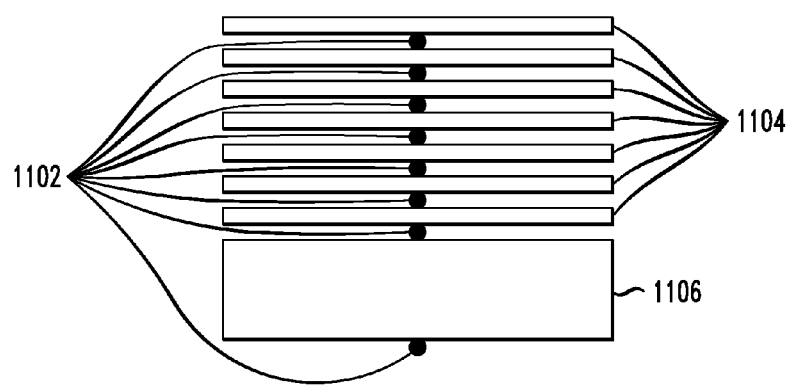
FIG. 10 shows a tunable radiation source, in accordance with an aspect of the invention.

Referring to FIG. 10, by using a series of thin alpha-particle sources (for example, 5.486 MeV thin sources), and absorbers, it is possible to produce a flat, or pill-box, energy spectrum. In particular, the sources are shown as the black dots 1102, and the layers 1104 are 1 μm thick aluminum foils; the first foil 1106 is 15 μm thick.

Figure 11:
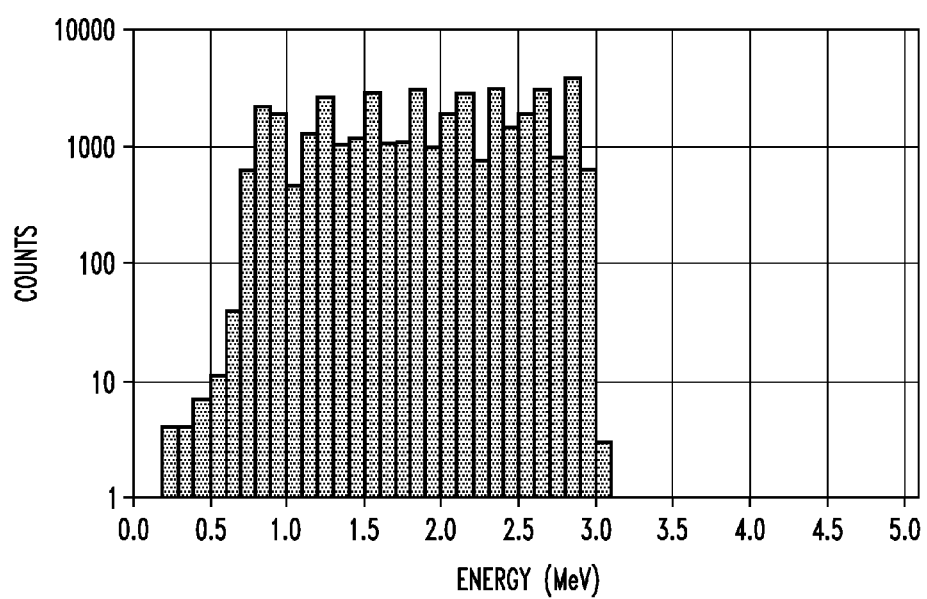
FIG. 11 shows a computer-simulated energy distribution for the source of FIG. 10.

By superimposing the sources and foils, it can be shown that the energy distribution is extended as depicted in FIG. 11, which shows a plot of the number of alpha particles on a logarithmic scale versus energy in MeV. More complete modeling can be used to ensure that the energy distribution is smooth, but this example is shown for illustration purposes.

A source whose energy distribution such as that shown in FIG. 11, e.g., pill box shape, can be used to help calibrate commercially available gas proportional counters. The alpha particles preferably have their maximum energy low enough so that they stop in the gas volume in the detector. Most alpha-emitting isotopes emit alpha particles at energies much higher than is appropriate to satisfy this requirement. Furthermore, the activity is preferably large enough that the calibration can be done in a short period of time. In a non-limiting exemplary application of one or more embodiments, a source such as that depicted in FIG. 10 can be employed, and the count rate can be measured in the detector as a function of a lower level discriminator, as described with respect to FIG. 12. An ideal energy distribution would be flat. Then the count rate should decrease linearly with the applied lower level discriminator setting (that is, cutting off low energy alpha particles with discriminator 1206 and changing the cut-off threshold). Measuring the count rate then allows the user to determine, empirically, the effective energy associated with the lower level discriminator.

One or more embodiments thus permit shaping the energy spectrum of a HUF material by producing the HUF from a series of thin film layers, each doped with a suitable alpha particle generator. Further, one or more embodiments provide a tunable radiation source that can be used in non-HUF, external "handheld" applications or the like.

The techniques described herein can be used, for example, in the fabrication and/or testing of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging over a variety of higher-end applications such as, for example, advanced computer products having a display, a keyboard or other input device, and a central processor.

Given the discussion thus far, it will be appreciated that, in general terms, an exemplary method, according to an aspect of the invention, includes the step 1302 of determining an energy distribution of soft error-inducing radiation likely to be encountered by an electronic circuit during operation. A further step includes preparing a tuned radiation source (e.g., FIG. 2, 3, or 11) having a source energy distribution similar to the determined energy distribution (as predicted by step 1310). A still further step includes testing the electronic circuit with the tuned radiation source.

With regard to determining an energy distribution of soft error-inducing radiation likely to be encountered by an electronic circuit during operation, in one or more embodiments, the energy distribution is determined by computer modeling, based on the materials used to fabricate the surface and anticipated radiation flux from space.

In some instances, as described with respect to FIG. 11, the preparing step includes interspersing a plurality of radiation sources with a plurality of absorbers. Furthermore, as noted elsewhere, the preparing step can be carried out using a variety of techniques, such as spin coating, rastering a dispensing needle under robotic control, and/or stencil and/or screen printing.

As discussed, for example, with respect to FIG. 13, in some cases the preparing step includes selecting an alpha-particle emitting isotope with an emission energy that is greater than a maximum predicted in the determining step, as per step 1304; selecting a desired activity of the alpha-particle emitting isotope, as per step 1306; selecting the absorber, as per step 1308; and modeling alpha particle transmission through the absorber, as per step 1310. Further steps include checking whether a result of the modeling step closely matches the energy distribution from the determining step; and, if so, fabricating the tuned radiation source in accordance with the modeling (otherwise, preferably iterate until the checking is affirmative).

In some instances, as described with respect to FIG. 3, the preparing step includes depositing on a substrate a first underfill layer doped with a first radioactive material and a second underfill layer doped with a second radioactive material different than the first radioactive material The substrate may be part of the circuit (HUF) or may be separate (external source).

In some instances, as described with respect to FIG. 2, the preparing step includes depositing on a substrate an underfill layer doped with a first radioactive material and a second radioactive material different than the first radioactive material. Again, the substrate may be part of the circuit (HUF) or may be separate (external source).

As shown in FIG. 1, in some instances, the preparing step includes applying the tuned radiation source to the electronic circuit as an underfill.

Figure 15:
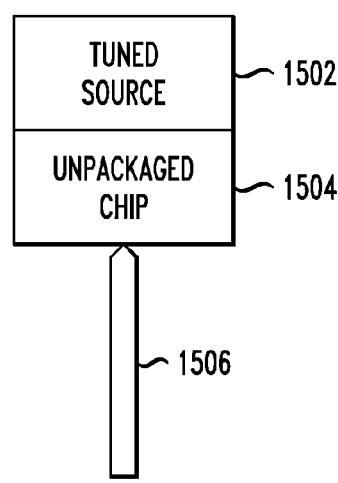
FIG. 15 shows use of a tuned external source.

However, the preparing step could instead include preparing the tuned radiation source as an external source, in which case the testing step includes bringing the external source into proximity with the electronic circuit. For example, as in FIG. 15, the electronic circuit may be a chip 1504 that is not mounted in a package, the tuned radiation source 1502 is placed on top of the chip, and the testing includes probing the chip with a probe 1506. In general, chip 1504 may or may not be wire-bonded.

In another aspect, with reference to FIG. 1, an exemplary structure, according to an aspect of the invention, includes a substrate 12, an integrated circuit chip 11 attached to and spaced from the substrate so as to define a gap 18 therebetween; and an underfill material 16 interposed in the gap.

The underfill material in turn includes a tuned radiation source having a plurality of individual radiation sources interposed with a plurality of absorbers, such as shown in FIG. 10.

The plurality of individual radiation sources can include, for example, alpha particle emitting sources.

In another aspect, an exemplary method includes determining a pillbox shaped energy distribution appropriate for calibrating a gas proportional detector; preparing a tuned radiation source having a source energy distribution similar to the energy distribution determined in the determining step; and calibrating the gas proportional detector with the tuned radiation source, as described elsewhere herein. In some cases, the preparing step comprises interspersing a plurality of radiation sources with a plurality of absorbers. See FIG. 12 and accompanying discussion.

In still another aspect, with reference to FIG. 13, an exemplary method includes modeling an energy distribution of soft error-inducing radiation likely to be encountered by an electronic circuit during operation, as per step 1302; selecting an alpha-particle emitting isotope with an emission energy that is greater than a maximum predicted in the modeling step, as per step 1304; selecting a desired activity of the alpha-particle emitting isotope, as per step 1306; selecting the absorber, as per step 1308; and modeling alpha particle transmission through the absorber, as per step 1310. Further steps include checking whether a result of the modeling step closely matches the energy distribution from the determining step; and, if so, specifying the tuned radiation source in accordance with the modeling. A further step can include fabricating the tuned radiation source in accordance with the specifying step. Furthermore, if the checking is not affirmative, an additional step can include iterating until the checking is affirmative.

In a non-limiting example, the modeling steps are carried out using a system, including at least one software module, embodied in a non-transitory manner on a non-transitory computer-readable storage medium. The at least one distinct software module includes a modeling engine module which implements a quantum mechanical treatment of ion-atom collisions. A non-limiting example is the above-mentioned TRIM program.

Exemplary System and Article of Manufacture Details

As will be appreciated by one skilled in the art, some aspects of the present invention may be embodied as a system, method or computer program product. Accordingly, some aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, some aspects of the present invention may take the form of a computer program product embodied in one or more computer readable medium(s) having computer readable program code embodied thereon. One non-limiting example of such aspects includes use of a general purpose computer to carry out modeling prior to manufacture of a source.

One or more embodiments of the invention, or elements thereof, can be implemented in the form of an apparatus including a memory and at least one processor that is coupled to the memory and operative to perform exemplary method steps.

Figure 14:
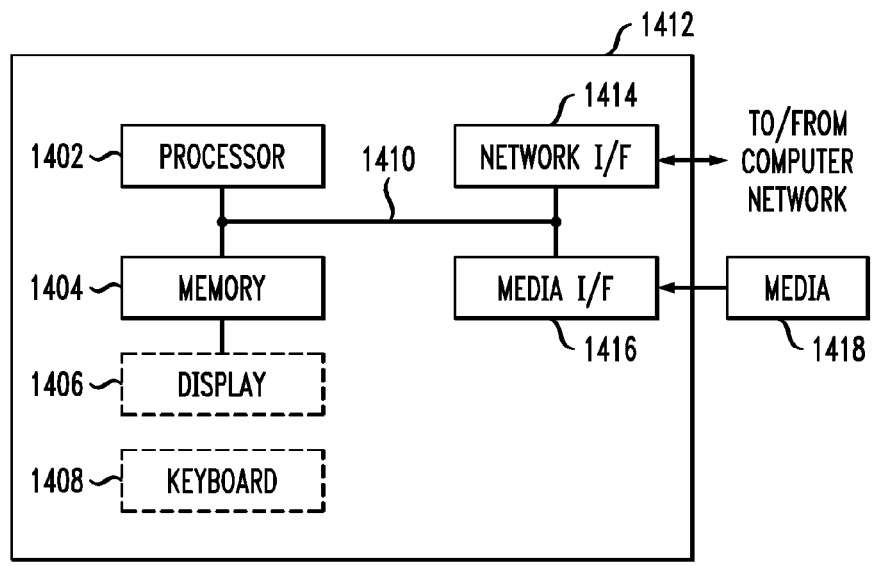
FIG. 14 depicts a computer system that may be useful in implementing one or more aspects and/or elements of the invention.

One or more embodiments can make use of software running on a general purpose computer or workstation. With reference to FIG. 14, such an implementation might employ, for example, a processor 1402, a memory 1404, and an input/output interface formed, for example, by a display 1406 and a keyboard 1408. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1402, memory 1404, and input/output interface such as display 1406 and keyboard 1408 can be interconnected, for example, via bus 1410 as part of a data processing unit 1412. Suitable interconnections, for example via bus 1410, can also be provided to a network interface 1414, such as a network card, which can be provided to interface with a computer network, and to a media interface 1416, such as a diskette or CD-ROM drive, which can be provided to interface with media 1418.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1402 coupled directly or indirectly to memory elements 1404 through a system bus 1410. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1408, displays 1406, pointing devices, and the like) can be coupled to the system either directly (such as via bus 1410) or through intervening I/O controllers (omitted for clarity).

Network adapters such as network interface 1414 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1412 as shown in FIG. 14) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1418 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a modeling engine module which implements a quantum mechanical treatment of ion-atom collisions. A non-limiting example is the above-mentioned TRIM program. At least some of the method steps can then be carried out using the distinct software module(s) and/or sub-module(s) of the system, as described above, executing on one or more hardware processors 1402. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   determining an energy distribution of soft error-inducing radiation likely to be encountered by an electronic circuit during operation;
   preparing a tuned radiation source having a source energy distribution similar to said energy distribution determined in said determining step; and
   testing said electronic circuit with said tuned radiation source;
   wherein said preparing step comprises interspersing a plurality of radiation sources with a plurality of absorbers.

2. The method of claim 1, wherein said preparing comprises spin coating.

3. The method of claim 1, wherein said preparing comprises rastering a dispensing needle under robotic control.

4. The method of claim 1, wherein said preparing comprises at least one of stencil and screen printing.

5. The method of claim 1, wherein said preparing comprises:
   selecting an alpha-particle emitting isotope with an emission energy that is greater than a maximum predicted in said determining step;
   selecting a desired activity of said alpha-particle emitting isotope;
   selecting said absorber;
   modeling alpha particle transmission through said absorber;
   checking whether a result of said modeling step closely matches said energy distribution from said determining step; and
   fabricating said tuned radiation source in accordance with said modeling if said checking is affirmative.

6. The method of claim 5, further comprising, if said checking is not affirmative, iterating until said checking is affirmative.

7. A method comprising:
   determining an energy distribution of soft error-inducing radiation likely to be encountered by an electronic circuit during operation;
   preparing a tuned radiation source having a source energy distribution similar to said energy distribution determined in said determining step; and
   testing said electronic circuit with said tuned radiation source;
   wherein said preparing step comprises depositing on a substrate a first underfill layer doped with a first radioactive material and a second underfill layer doped with a second radioactive material different than said first radioactive material.

8. A method comprising:
   determining an energy distribution of soft error-inducing radiation likely to be encountered by an electronic circuit during operation;
   preparing a tuned radiation source having a source energy distribution similar to said energy distribution determined in said determining step; and
   testing said electronic circuit with said tuned radiation source;
   wherein said preparing step comprises depositing on a substrate an underfill layer doped with a first radioactive material and a second radioactive material different than said first radioactive material.

9. A method comprising:
   determining an energy distribution of soft error-inducing radiation likely to be encountered by an electronic circuit during operation;
   preparing a tuned radiation source having a source energy distribution similar to said energy distribution determined in said determining step; and
   testing said electronic circuit with said tuned radiation source;
   wherein said preparing step comprises applying said tuned radiation source to said electronic circuit as an underfill.

10. A method comprising:
    determining an energy distribution of soft error-inducing radiation likely to be encountered by an electronic circuit during operation;
    preparing a tuned radiation source having a source energy distribution similar to said energy distribution determined in said determining step; and
    testing said electronic circuit with said tuned radiation source;
    wherein said preparing step comprises preparing said tuned radiation source as an external source;
    wherein said testing step comprises bringing said external source into proximity with said electronic circuit;
    wherein said electronic circuit comprises a chip that is not mounted in a package;
    wherein said bringing said external source into proximity comprises laying said tuned radiation source on top of said chip; and
    wherein said testing comprises probing said chip with a probe.

11. A method comprising:
    determining a pillbox shaped energy distribution appropriate for calibrating a gas proportional detector;
    preparing a tuned radiation source having a source energy distribution similar to said energy distribution determined in said determining step; and
    calibrating said gas proportional detector with said tuned radiation source.

12. The method of claim 11, wherein said preparing step comprises interspersing a plurality of radiation sources with a plurality of absorbers.

13. A method comprising:
    modeling an energy distribution of soft error-inducing radiation likely to be encountered by an electronic circuit during operation;
    selecting an alpha-particle emitting isotope with an emission energy that is greater than a maximum predicted in said modeling step;
    selecting a desired activity of said alpha-particle emitting isotope;

selecting an absorber;

modeling alpha particle transmission through said absorber;

checking whether a result of said step of modeling said alpha particle transmission through said absorber closely matches said energy distribution from said step of modeling said energy distribution of said soft error-inducing radiation likely to be encountered by said electronic circuit during operation; and specifying a tuned radiation source in accordance with said modeling steps if said checking is affirmative.

14. The method of claim 13, further comprising fabricating said tuned radiation source in accordance with said specifying.

15. The method of claim 13, further comprising, if said checking is not affirmative, iterating until said checking is affirmative.

16. The method of claim 13, further comprising providing a system, wherein the system comprises at least one software module, embodied in a non-transitory manner on a non-transitory computer-readable storage medium, and wherein the at least one distinct software module comprises a modeling engine module which implements a quantum mechanical treatment of ion-atom collisions;

wherein:
said modeling steps are carried out by said modeling engine module executing on at least one hardware processor.

* * * * *